United States Patent
Melvin, III et al.

(10) Patent No.: US 7,496,880 B2
(45) Date of Patent: Feb. 24, 2009

(54) METHOD AND APPARATUS FOR ASSESSING THE QUALITY OF A PROCESS MODEL

(75) Inventors: Lawrence S. Melvin, III, Hillsboro, OR (US); Qiliang Yan, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 499 days.

(21) Appl. No.: 11/243,306

(22) Filed: Oct. 3, 2005

(65) Prior Publication Data

US 2006/0236297 A1 Oct. 19, 2006

Related U.S. Application Data

(60) Provisional application No. 60/662,726, filed on Mar. 17, 2005.

(51) Int. Cl.
*G06F 17/50* (2006.01)
(52) U.S. Cl. ............... 716/19; 716/20; 716/21
(58) Field of Classification Search ............ 716/4, 716/19–21; 430/5, 30; 382/254, 256, 260, 382/298, 299
See application file for complete search history.

(56) References Cited

U.S. PATENT DOCUMENTS

| | | | | |
|---|---|---|---|---|
| 6,792,592 B2* | 9/2004 | Keogan et al. | ................. | 716/19 |
| 6,795,587 B2* | 9/2004 | Slavin | ........................ | 382/260 |
| 7,243,332 B2* | 7/2007 | Melvin et al. | .................. | 716/21 |
| 7,251,807 B2* | 7/2007 | Melvin et al. | .................. | 716/21 |
| 7,315,999 B2* | 1/2008 | Melvin et al. | .................. | 716/20 |
| 2003/0220828 A1* | 11/2003 | Hwang et al. | .................. | 705/8 |

* cited by examiner

*Primary Examiner*—Vuthe Siek
(74) *Attorney, Agent, or Firm*—Park, Vaughan & Fleming LLP

(57) ABSTRACT

One embodiment of the present invention provides a system that assesses the quality of a process model. During operation, the system receives a mask layout and additionally receives a process model that models the effects of one or more semiconductor manufacturing processes on the mask layout. Next, the system computes a gradient of the process model with respect to a process model parameter. The system then computes a quality indicator at an evaluation point in the mask layout using the gradient of the process model and the mask layout. Next, the system assesses the quality of the process model using the quality indicator. In one embodiment, the system assesses the quality of the process model by comparing the quality indicator with a threshold.

9 Claims, 5 Drawing Sheets

METHOD AND APPARATUS FOR ASSESSING THE QUALITY OF A PROCESS MODEL

RELATED APPLICATION

This application hereby claims priority under 35 U.S.C. §119 to U.S. Provisional Patent Application No. 60/662,726, filed on 17 Mar. 2005, entitled "Methodology to Rapidly Evaluate the Quality of a Process Model," by inventors Lawrence S. Melvin III and Qiliang Yan.

BACKGROUND

1. Field of the Invention

The present invention relates to integrated circuit fabrication. More specifically, the present invention relates to a method and apparatus for rapidly assessing the quality of a process model for a mask layout using simulation.

2. Related Art

Dramatic improvements in semiconductor integration circuit (IC) technology presently make it possible to integrate tens of millions of transistors onto a single semiconductor IC chip. These improvements in integration densities have been achieved through corresponding improvements in semiconductor manufacturing technologies. In particular, advances in optical lithography technology have been driving IC chip feature sizes into deep submicron ranges, with the help of Optical Proximity Correction (OPC) techniques.

Model-based OPC techniques typically use a process model to correct a given layout. The process model allows the OPC technique to simulate the effects of one or more semiconductor manufacturing processes, which enables the OPC technique to ensure that the corrections made to the layout will result in an IC chip with the desired characteristics. Note that, in order for an OPC technique to be effective, it is very important that the process model accurately predict corrections for all pattern configurations encountered in a target layout, most of which might be different from those pattern configurations used for fitting the process model. Therefore, it is desirable to evaluate the quality of the process model on any given layout.

Unfortunately, current techniques for assessing the quality of a process model have many drawbacks. The best-known techniques for determining the quality of a process model are to determine how well they predict an empirically measured data set (i.e. process data), wherein the process data is taken on pattern configurations not used for model calibration. These measurement-based techniques are effective in helping to determine the quality of a model, but are limited by processing and data collection time. Because the gathering of process data is labor-intensive and time-consuming, the model is assessed using a small number of test patterns, which severely limits the accuracy of the assessment process due to the small sample size. So it is impossible to guarantee a model's predictive capabilities on all test patterns with these techniques. Additionally, measurement-based techniques have difficulty determining if an inaccuracy in the model is the result of errors in data collection or the model itself.

Hence, what is needed is a method and an apparatus for rapidly assessing the quality of a process model without the above-described problems.

SUMMARY

One embodiment of the present invention provides a system that assesses the quality of a process model. During operation, the system receives a mask layout and additionally receives a process model that models the effects of one or more semiconductor manufacturing processes on the mask layout. Next, the system computes a gradient of the process model with respect to a process model parameter. The system then computes a quality indicator at an evaluation point in the mask layout using the gradient of the process model and the mask layout. Next, the system assesses the quality of the process model using the quality indicator. In one embodiment, the system assesses the quality of the process model by comparing the quality indicator with a threshold.

In a variation on this embodiment, prior to receiving the process model, the system generates the process model by: receiving a test layout; obtaining process data by applying the one or more semiconductor manufacturing processes to the test layout; and fitting a statistical model to the process data to obtain the process model.

In a further variation on this embodiment, the system represents the process model using a set of kernel functions and a set of coefficients associated with the kernel functions.

In a variation on this embodiment, the system computes the quality indicator by convolving the gradient of the process model with the mask layout.

In a further variation on this embodiment, the system assesses the quality of the process model by comparing the quality indicator with a threshold. If the quality indicator is below a first threshold, the process model is determined to be normally sensitive to the process model parameter, which indicates that the process model is of a high quality. On the other hand, if the quality indicator is above a second threshold, the process model is determined to be overly sensitive to the process model parameter, which indicates that the process model is of a low quality.

In a further variation on this embodiment, if the system determines that the quality indicator is above the second threshold, the system refits the statistical model to the process data to obtain a second process model that is of a better quality than the process model.

In a variation on this embodiment, the system uses the method to identify a high quality process model, which is subsequently used by an optical proximity correction (OPC) process.

DETAILED DESCRIPTION

Integrated Circuit Design Flow

Figure 1:
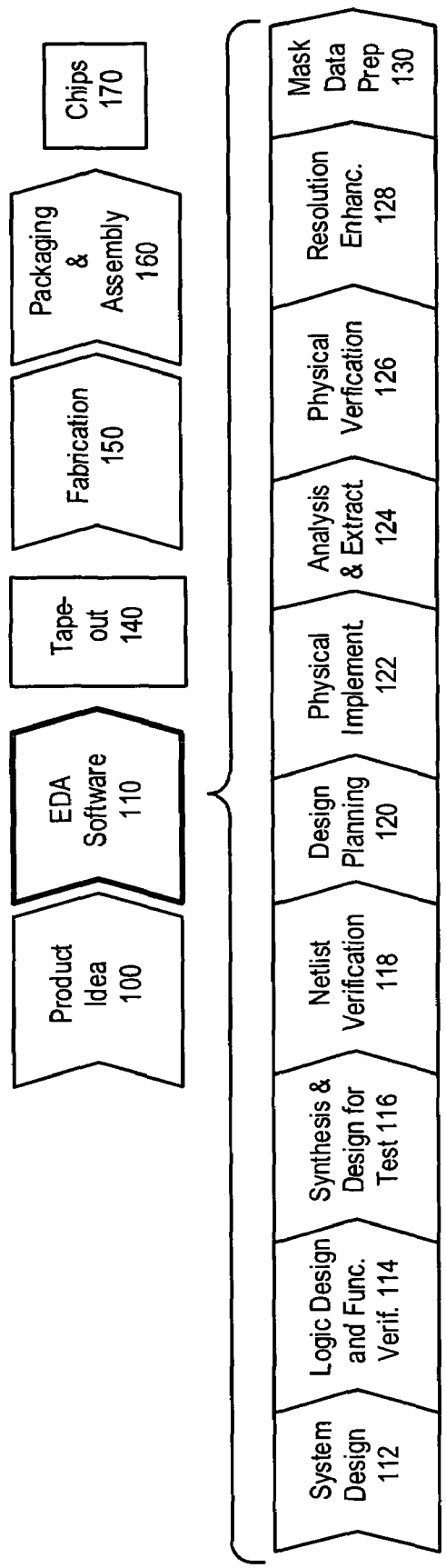
FIG. 1 illustrates an exemplary integrated circuit design flow in accordance with an embodiment of the present invention.

FIG. 1 illustrates an exemplary integrated circuit design flow in accordance with an embodiment of the present invention.

The process starts with the product idea (step 100) which is realized using an EDA software design process (step 110). When the design is finalized, it can be taped-out (event 140). After tape out, the fabrication process (step 150) and packaging and assembly processes (step 160) are performed which ultimately result in finished chips (result 170).

The EDA software design process (step 110), in turn, comprises steps 112-130, which are described below. Note that the design flow description is for illustration purposes only. Specifically, this description is not meant to limit the present invention. For example, an actual integrated circuit design may require the designer to perform the design steps in a different sequence than the sequence described below. The following text provides a brief description of the steps in the design process (step 110).

System design (step 112): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 120): Here, an overall floorplan for the chip is constructed and analyzed for timing and top-level routing. Exemplary EDA software products from Synopsys, Inc. that can be used at this step include Astro and IC Compiler products.

Physical implementation (step 122): The placement (positioning of circuit elements) and routing (connection of the same) occurs at this step. Exemplary EDA software products from Synopsys, Inc. that can be used at this step include the Astro and IC Compiler products.

Analysis and extraction (step 124): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 126): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 128): This step involves geometric manipulations of the layout to improve manufacturability of the design. Exemplary EDA software products from Synopsys, Inc. that can be used at this step include Proteus, ProteusAF, and PSMGen products.

Mask data preparation (step 130): This step provides the "tape-out" data for production of masks for lithographic use to produce finished chips. Exemplary EDA software products from Synopsys, Inc. that can be used at this step include the CATS(R) family of products.

Note that embodiments of the present invention can be used during one or more of the above described steps. Specifically, one embodiment of the present invention can be used during the resolution enhancement step 128.

Fitting a Process Model

The process models used in OPC include mathematical functions that are tuned to fit to empirical data. These mathematical functions are used to predict the behavior of one or more semiconductor processes, such as an optical lithography process. More specifically, in order to obtain a process model for an optical lithography process, empirical data is collected by applying the process to a set of test patterns. This involves using an optical lithography process to print test patterns for a test layout on a wafer, which is coated with photoresist. These patterns are then measured in the photoresist, or alternatively measured on the wafer after the etch process. In particular, critical dimensions (CD) of features in the patterns may be measured using Scanning Electron Microscopy (SEM). Next, the collected measurement data set (or process data) is used to generate a process model by fitting the data set to a statistical model.

Note, the process model can be represented using a set of kernel functions and a set of coefficients associated with the kernel functions.

The process model obtained from fitting the process data is then used to predict the effects of the semiconductor manufacturing processes on a mask layout. Note, the mask layout may contain patterns that are different from the test patterns. Hence, a key assumption is that if the process model accurately predicts the effect of the processes on the test patterns, it will also accurately predict the effects of the processes on other patterns.

Process Model Error

Creating a single accurate process model for different mask layouts is difficult. This is because the quality of the process model is affected by errors. Typically, there are four potential categories of errors associated with process model accuracy.

The first category of errors is Measurement Error. This type of error is associated with errors in the empirical data collection process. Specifically, the sources of this error can include: (a) Photoresist shape change (b) Uncertainty in CDSEM calibration; (c) CDSEM Operator experience; and (d) Time required to measurement the test pattern.

The second category of errors is Model Form Error. This type of error is associated with whether the mathematical expression chosen to fit the empirical data actually represents the physical process. In a black box form (or non-physical form), a high order polynomial is used to fit the empirical data. This methodology can give excellent fit results around empirical data points, producing relatively small residual error. However extrapolation and interpolation between empirical data points can be problematic in a black box fit.

Figure 2A:
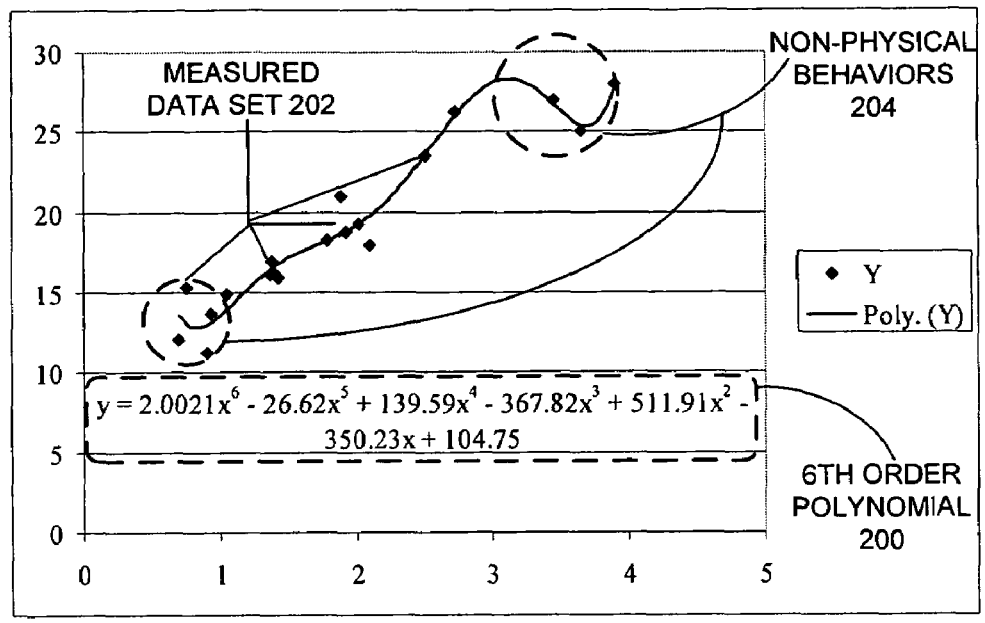
FIG. 2A illustrates how a process model fits to noisy measurement data using a black-box model form in accordance with an embodiment of the present invention.

FIG. 2A illustrates how a process model fits to noisy measurement data using a black-box model form in accordance with an embodiment of the present invention. In this example, a sixth-order polynomial function 200 is used to fit measured data set 202 for x values between 0 and 5. Note that in the middle of the x values (x between 1 and 3), measured data set 202 is fit well by function 200. However, for x values above 3 and below 1, non-physical segments 204 are being used to fit the data points in these areas in a non-physical manner. Hence, polynomial function 200 has poor interpolation abilities for x values above 3 and below 1. Further note that, at each end of the modeled data represented by curves 204, the modeled data turns upward producing a rapidly increasing value that is not indicated by measured data set 202. Hence, polynomial function 200 also has poor extrapolation capability.

In contrast, in physical-model form, the empirical data are fit to an analytical model that generally follows the data trend. This fitting methodology can provide an extrapolation that follows the empirical trend. However, the fitting can have large error bands when the empirical data are scattered over a large area, which commonly occurs in noisy empirical wafer data.

Figure 2B:
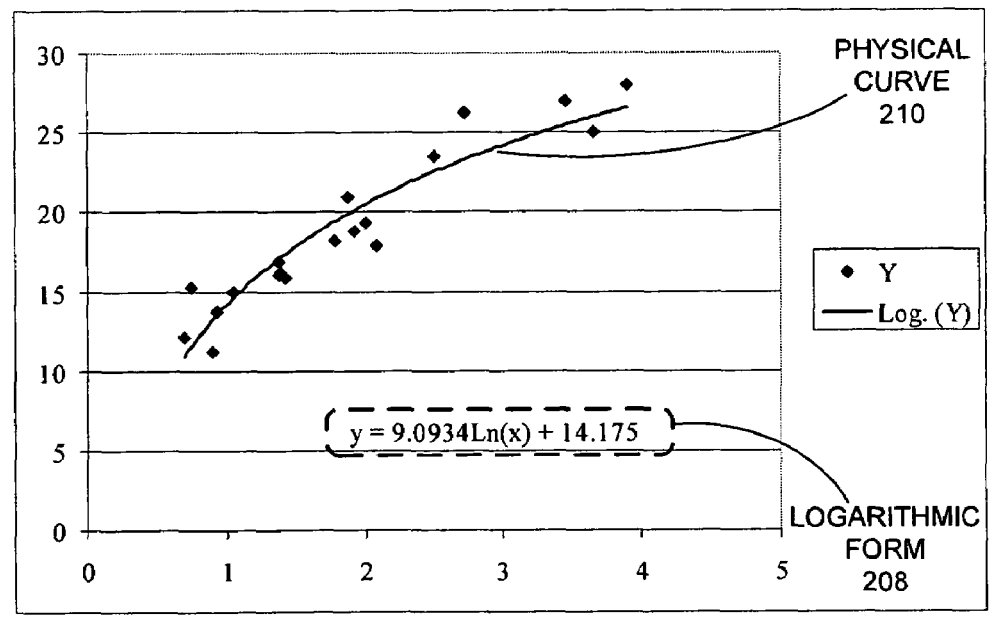
FIG. 2B illustrates how a process model fits to noisy measurement data using a logarithmic physical-model form in accordance with an embodiment of the present invention.

FIG. 2B illustrates how a process model fits to the same noisy measurement data set as in FIG. 2A using a physical-model form of logarithmic 208 in accordance with an embodiment of the present invention. Note that the residual error in FIG. 2B is typically higher than in FIG. 2A, but the interpolation of the physical curve 210 between data points always lies within the empirical data. In addition, the extrapolation of 210 follows the empirical trend at both ends of the modeled data.

The third category of errors is Model Fitting Error. This type of error occurs when the predicted value from the process model does not match process behavior represented by the empirical data. The difference between the empirical data and the modeled value is referred to as the "residual error" in the model. Model fitting works to reduce or even remove the residual model error from the model fit. However, with noisy empirical data or a poor choice of model form, the residual error can become large. Higher-order models normally have smaller residual errors than lower-order models. This is offset by the predictive power of the higher-order models outside of the data range. In general, it is better to obtain good empirical data measurements and fit the data with a physical model than to use a non-physical model to fit noisy data sets.

The fourth category of errors is Model Representation Error. Typically, process models are represented using eigenfunctions to improve computation speed during Resolution Enhancement Techniques (RET) processes. This type of error is associated with: (1) whether enough eigenfunctions are used to represent the model and (2) correctness of the used eigenfunctions. As more eigenfunctions are used in the model, the model representation can be improved but at the cost of requiring more computation time to correct a pattern. If too few eigenfunctions are used, the predictive power of the model degrades to the point of the becoming unreliable. Therefore, it is necessary to use the fewest number of eigenfunctions to represent the model without losing prediction power.

Assessing the Quality of Process Model

The quality of a process model determines how accurately the process model can predict the effects of one or more semiconductor manufacturing processes on a mask layout. Note, the "quality" of a process model is relative to specific mask layouts. For example, a process model of good quality for a given mask layout A may be a poor process model for another mask layout B.

The quality of the process model can be affected by all four model errors described above. Typically, the measurement error can be minimized during data collection. However, once it is included in the modeling process, it is difficult to detect. On the contrary, the effects by all other 3 model errors, i.e., model fitting, model form, and model representation, on the quality of the process model may be assessed prior to applying the process model to a new mask layout.

Figure 3:
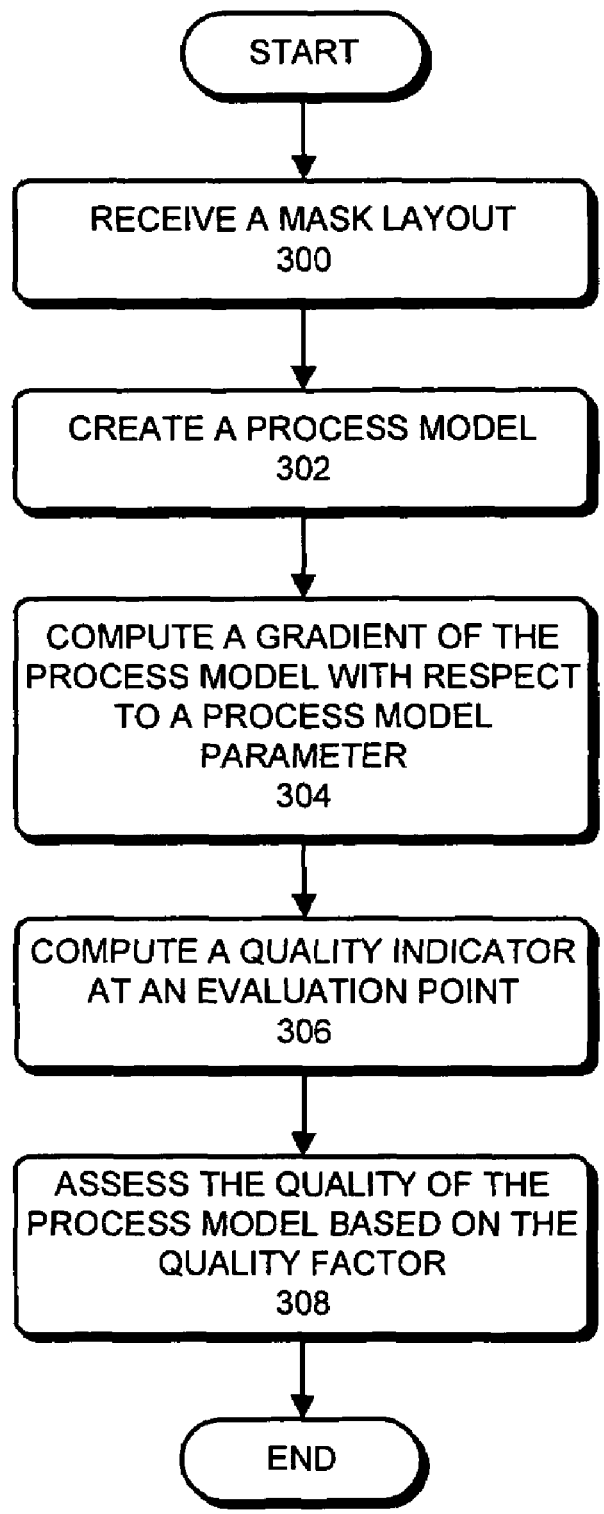
FIG. 3 presents a flowchart illustrating a process of assessing the quality of a process model for a mask layout in accordance with an embodiment of the present invention.

FIG. 3 presents a flowchart illustrating the process of assessing the quality of a process model for a mask layout in accordance with an embodiment of the present invention.

The process starts by receiving the mask layout (step 300) and additionally receiving a process model, which models the effects of one or more semiconductor manufacturing processes (step 302). Note, the process model is generated by fitting an empirical data set obtained for a test mask layout, which typically includes a number of standard test patterns. Furthermore, it is important to ensure that the semiconductor manufacturing processes used on the test mask layout is the same as the processes to be used to transfer subsequent mask layouts to be manufactured.

Next, the process computes the gradient of the process model with respect to a process model parameter. This process model parameter can include, but not limited to, numerical aperture (NA), partial coherence, or photoresist thickness (step 304).

The process then computes a quality indicator at an evaluation point in the mask layout using the gradient of the process model and the mask layout (step 306). Specifically, the system can compute the quality indicator by convolving the gradient of the process model with a multidimensional (e.g., 2-D function in the spatial domain) function that represents the mask layout.

Note that, unlike the process model, the mask layout is mathematically independent of any process model parameters, such as NA, partial coherence, or photoresist thickness. As a result, the order of computing the gradient of the process model in step 306 and the convolution of the gradient of the process model with the multidimensional function that represents the mask layout are interchangeable. Namely, convolving the gradient of the process model with the mask layout is equivalent to convolving the process model with the mask layout function, and then computing the gradient of the result. Note that the first technique, i.e., convolving the gradient of the process model with the mask layout, is usually preferred over the second technique because the first technique typically requires less computation than the second technique.

Furthermore, note that, if the process model is an optical lithography model, the output of the convolution gives the aerial-image intensity. Hence, in this case, the quality indicator is the gradient of the aerial-image intensity with respect to the process model parameter. Mathematically, the quality indicator specifies how sensitive the process model is to the process model parameter.

The process then assesses the quality of the process model using the quality indicator (step 308). More specifically, the process assesses the quality of the process model by comparing the quality indicator with a threshold. The threshold can be determined using a calibration routine that determines how much model error is considered acceptable. This calibration can be performed by using known good and poor fit locations on the test patterns to calibrate the threshold for model quality.

If the quality indicator is below the threshold, the process model is determined to be normally sensitive to the process model parameter, which indicates that the process model is of a high quality. In contrast, if the quality indicator is above the threshold, the process model is determined to be overly sensitive to the process model parameter, which indicates that the process model is of a low quality.

If the quality indicator is found to be above the threshold, the process can refit the process data of the test layout or use additional process data to obtain a new process model that is of a better quality than the original process model.

In another embodiment of the present invention, two thresholds may be used, that is, a low threshold and a high threshold. In such embodiment, a quality indicator below the low threshold represents high quality process model, while a quality indicator above the high threshold represents poor quality process model which needs to be improved. When a quality indicator is in between the two thresholds, the corresponding process model may be used, but a user can choose to investigate corresponding regions on a wafer which give rise to such a quality indicator during an optical lithography process using this process model.

Example of Assessing Quality of Process Model

Figure 4A:
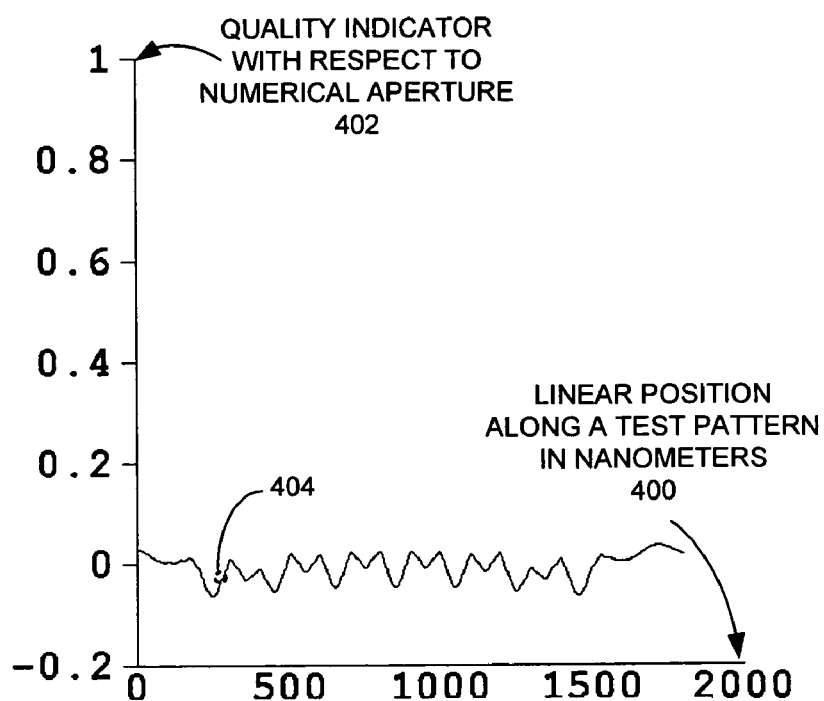
FIG. 4A illustrates a quality indicator plot based on a first process model that has a variation with respect to numerical aperture (NA) in accordance with an embodiment of the present invention.
Figure 4B:
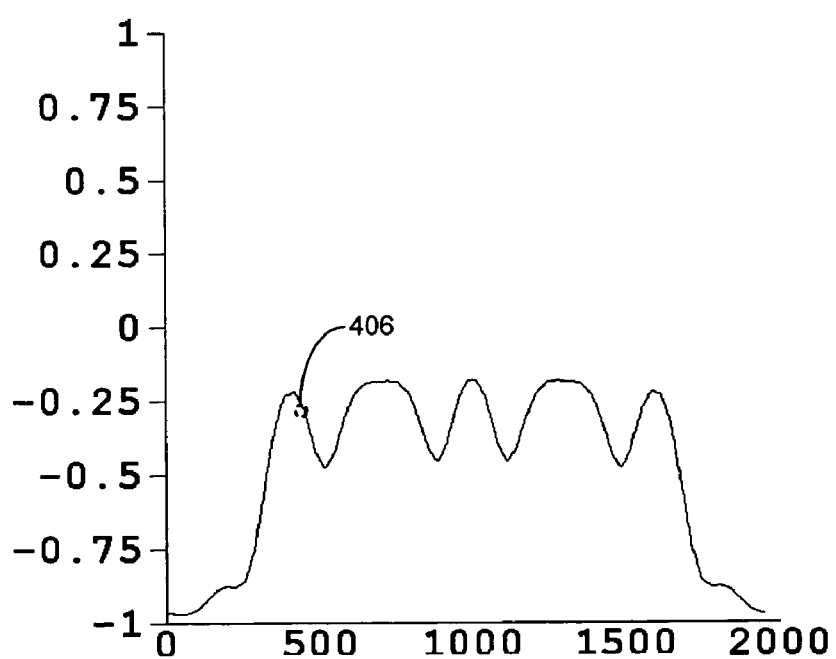
FIG. 4B illustrates a quality indicator plot based on a second process model that has a variation with respect to NA in accordance with an embodiment of the present invention.

FIGS. 4A and 4B illustrate an embodiment of the present invention which assesses the quality of the process model by computing a quality indicator for the process model with respect to process model parameter variation in accordance with an embodiment of the present invention.

FIG. 4A illustrates a quality indicator plot based on a first process model that has a variation with respect to NA in accordance with an embodiment of the present invention. The horizontal axis of the plot represents the linear position along a test pattern's cross-section with respect to a zero reference point (400). The vertical axis of the plot represents the values of the quality indicator (402). In other words, the vertical axis of the plot represents the values of $\delta I/\delta NA$, that is, the gradient of the aerial-image intensity, wherein the aerial-image intensity is computed by convolving the test pattern with the process model. Therefore, each data point 404 in FIG. 4A represents the quality indicator value with respect to NA variation computed at a specific linear position along the test pattern.

Note, even thought the value of the gradient in FIG. 4A and therefore the quality factor can be either position or negative, only magnitude of the quality factor is important. Hence, typically the magnitude of the quality factor is used in comparison with a threshold.

For the first process model used to fit the empirical data in FIG. 4A, there are enough eigenfunctions to adequately represent the empirical data. As a result, the magnitudes of quality indicator values are small.

FIG. 4B illustrates a quality indicator plot based on a second process model that has a variation with respect NA in accordance with an embodiment of the present invention. Again, each data point 406 in FIG. 4B represents the quality indicator value with respect to NA variation computed at a specific position along the same test pattern as FIG. 4A. Furthermore, the empirical data set used to obtain the second process model is identical to the one used for the first process model. However, for the second process model in FIG. 4B, less than a sufficient number of eigenfunctions are used to represent the empirical data. Therefore, it has larger model representation error than the first process model. This is clearly illustrated by the magnitudes of the quality indicator values in FIG. 4B which are much greater at every evaluation point along the test pattern, compared to the corresponding values in FIG. 4A.

Consequently, the first process model has higher quality than the second process model. Note that, even thought the present example illustrates specifically the effect of model representation error on the process model quality, the other process model errors can all affect the process model quality.

Validating a Process Model

Figure 5:
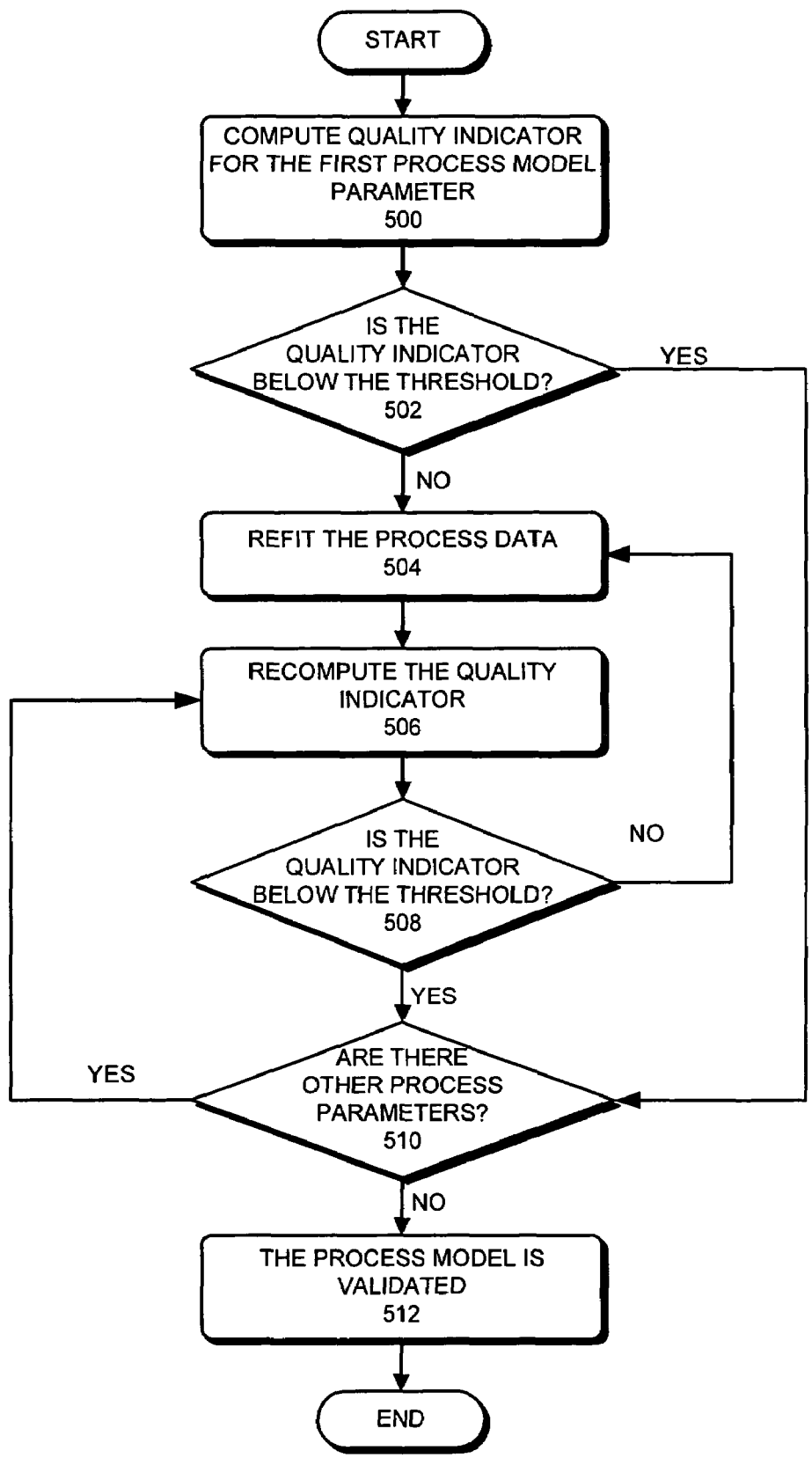
FIG. 5 presents a flowchart illustrating a process of validating a process model against a mask layout for all process model parameters in accordance with an embodiment of the present invention.

FIG. 5 presents a flowchart illustrating the process of validating a process model against a mask layout for all process model parameters in accordance with an embodiment of the present invention.

The process begins by computing a quality indicator for a first process model parameter (step 500). Next, the process determines whether the quality indicator computed for the mask layout is below the threshold which indicates the process model is of high quality (step 502). If so, the process advances to the next process model parameter (step 510). Otherwise, the process refits the process data for the test layout that was used to calibrate the process model, thus generating an improved process model (step 504). In one embodiment of the present invention, the process can refit the process data using a new statistical fitting model which may reduce model form error. In another embodiment, the process can refit the process data by increasing the number of eigenfunctions used to represent the process data, thereby reducing model representation error. In yet another embodiment, the process can refit the process data by adding additional measured data or eliminating non-physical process data in the original process data set, thereby reducing model fitting error.

After refitting the process data to obtain the improved process model, the process then recomputes the quality indicator (step 506) for the first process model parameter. The process then determines whether the recomputed quality indicator is below the threshold (step 508). If so, the improved process model is of high quality with respect to the first process model parameter, and the model evaluation process advances to next process model parameter (step 510). Otherwise, the process returns to step 404 for another refitting step. This process continues until the quality indicator is eventually below the problem threshold.

After the process has tuned the process model for all the process model parameters, which means that all associated quality indicators are below the threshold, the process model is validated and is subsequently regarded as high-quality for the mask layout (step 512).

CONCLUSION

The data structures and code described in the foregoing description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent. Additionally, the above disclosure is not intended to limit the present invention. The scope of the present invention is defined by the appended claims.

What is claimed is:

1. A method for assessing the quality of a process model, the method comprising:

receiving a mask layout;

receiving a process model which models the effects of one or more semiconductor manufacturing processes on the mask layout;

computing a gradient of the process model with respect to a process model parameter;

computing a quality indicator at an evaluation point in the mask layout by convolving the gradient of the process model with the mask layout; and assessing the quality of the process model by comparing the quality indicator with a threshold, wherein if the quality indicator is below a first threshold, the process model is determined to be normally sensitive to the process model parameter, which indicates that the process model is of a high quality;

wherein if the quality indicator is above a second threshold, the process model is determined to be overly sensitive to the process model parameter, which indicates that the process model is of a low quality, wherein if the quality indicator is above second threshold, the method further comprises refitting a statistical model to the process data to obtain a second process model that is of a better quality than the process model; and wherein the method is used to identify a high quality process model, which is subsequently used by an optical proximity correction (OPC) process.

2. The method of claim 1, wherein prior to receiving the process model, the method further comprises:

receiving a test layout;

obtaining process data by applying the one or more semiconductor manufacturing processes to the test layout; and fitting a statistical model to the process data to obtain the process model.

3. The method of claim 2, wherein the process model can be represented using a set of kernel functions and a set of coefficients associated with the kernel functions.

4. A computer-readable storage medium storing instructions that when executed by a computer cause the computer to perform a method for assessing the quality of a process model, the method comprising:

receiving a mask layout;

receiving a process model which models the effects of one or more semiconductor manufacturing processes on the mask layout;

computing a gradient of the process model with respect to a process model parameter;

computing a quality indicator at an evaluation point in the mask layout by convolving the gradient of the process model with the mask layout; and assessing the quality of the process model by comparing the quality indicator with a threshold, wherein if the quality indicator is below a first threshold, the process model is determined to be normally sensitive to the process model parameter, which indicates that the process model is of a high quality;

wherein if the quality indicator is above a second threshold, the process model is determined to be overly sensitive to the process model parameter, which indicates that the process model is of a low quality, wherein if the quality indicator is above second threshold, the method further comprises refitting a statistical model to the process data to obtain a second process model that is of a better quality than the process model; and wherein the method is used to identify a high quality process model, which is subsequently used by an optical proximity correction (OPC) process.

5. The computer-readable storage medium of claim 4, wherein prior to receiving the process model, the method further comprises:

receiving a test layout;

obtaining process data by applying the one or more semiconductor manufacturing processes to the test layout; and fitting a statistical model to the process data to obtain the process model.

6. The computer-readable storage medium of claim 5, wherein the process model can be represented using a set of kernel functions and a set of coefficients associated with the kernel functions.

7. An apparatus for assessing the quality of a process model, comprising:

a first receiving mechanism configured to receive a mask layout;

a second receiving mechanism configured to receive a process model which models the effects of one or more semiconductor manufacturing processes on the mask layout;

a first computing mechanism configured to compute a gradient of the process model with respect to a process model parameter;

a second computing mechanism configured to compute a quality indicator at an evaluation point in the mask layout by convolving the gradient of the process model with the mask layout; and an assessment mechanism configured to assess the quality of the process model by comparing the quality indicator with a threshold, wherein if the quality indicator is below a first threshold, the process model is determined to be normally sensitive to the process model parameter, which indicates that the process model is of a high quality;

wherein if the quality indicator is above a second threshold, the process model is determined to be overly sensitive to the process model parameter, which indicates that the process model is of a low quality, wherein if the quality indicator is above second threshold, the method further comprises refitting a statistical model to the process data to obtain a second process model that is of a better quality than the process model; and wherein the method is used to identify a high quality process model, which is subsequently used by an optical proximity correction (OPC) process.

8. The apparatus of claim 7, wherein prior to receiving the process model, the method further comprises:

a receiving mechanism configured to receive a test layout;

an obtaining mechanism configured to obtain process data by applying the one or more semiconductor manufacturing processes to the test layout; and a fitting mechanism configured to fit a statistical model to the process data to obtain the process model.

9. The apparatus of claim 8, wherein the process model can be represented using a set of kernel functions and a set of coefficients associated with the kernel functions.

* * * * *